(12) United States Patent
Lee (10) Patent No.: US 7,088,119 B2
(45) Date of Patent: Aug. 8, 2006

(54) MECHANISM FOR TESTING PRINTED CIRCUIT BOARD

(75) Inventor: Hsiao-Chen Lee, Hsinchu (TW)

(73) Assignee: ASUSTek Computer Inc., Taipei (TW)

( * ) Notice: Subject to any disclaimer, the term of this patent is extended or adjusted under 35 U.S.C. 154(b) by 0 days.

(21) Appl. No.: 10/936,508

(22) Filed: Sep. 9, 2004

(65) Prior Publication Data

US 2005/0112948 A1    May 26, 2005

(30) Foreign Application Priority Data

Nov. 26, 2003   (TW) .............................. 92133138 A (51) Int. Cl.
*G01R 31/02* (2006.01)
(52) U.S. Cl. .................................... 324/755; 324/158.1
(58) Field of Classification Search .................... None
See application file for complete search history.

(56) References Cited

U.S. PATENT DOCUMENTS 6,828,777 B1 *  12/2004  Ou et al. ................. 324/158.1

* cited by examiner

*Primary Examiner*—Ernest Karlsen
(74) *Attorney, Agent, or Firm*—Birch, Stewart, Kolasch, and Birch, LLP (57) ABSTRACT

A mechanism for testing a printed circuit board. The mechanism includes a holder, an expansion board and at least one fixing member. The expansion board has a first edge where a contact zone is provided. The expansion board is partially disposed in the holder with the first edge thereof exposed. The first edge of the expansion board is inserted into an expansion slot of the printed circuit board, while the contact zone provides electrical connection to the expansion slot. The fixing member fixes the expansion board in the holder.

15 Claims, 7 Drawing Sheets

MECHANISM FOR TESTING PRINTED CIRCUIT BOARD

This Nonprovisional application claims priority under 35 U.S.C. § 119(a) on Patent Application No(s). 092133138 filed in Taiwan, Republic of China on Nov. 26, 2003, the entire contents of which are hereby incorporated by reference.

BACKGROUND OF THE INVENTION

1. Field of the Invention

The present invention relates to a testing mechanism, and in particular to a PCB testing mechanism with high efficiency and stability.

2. Description of the Related Art

Figure 1:
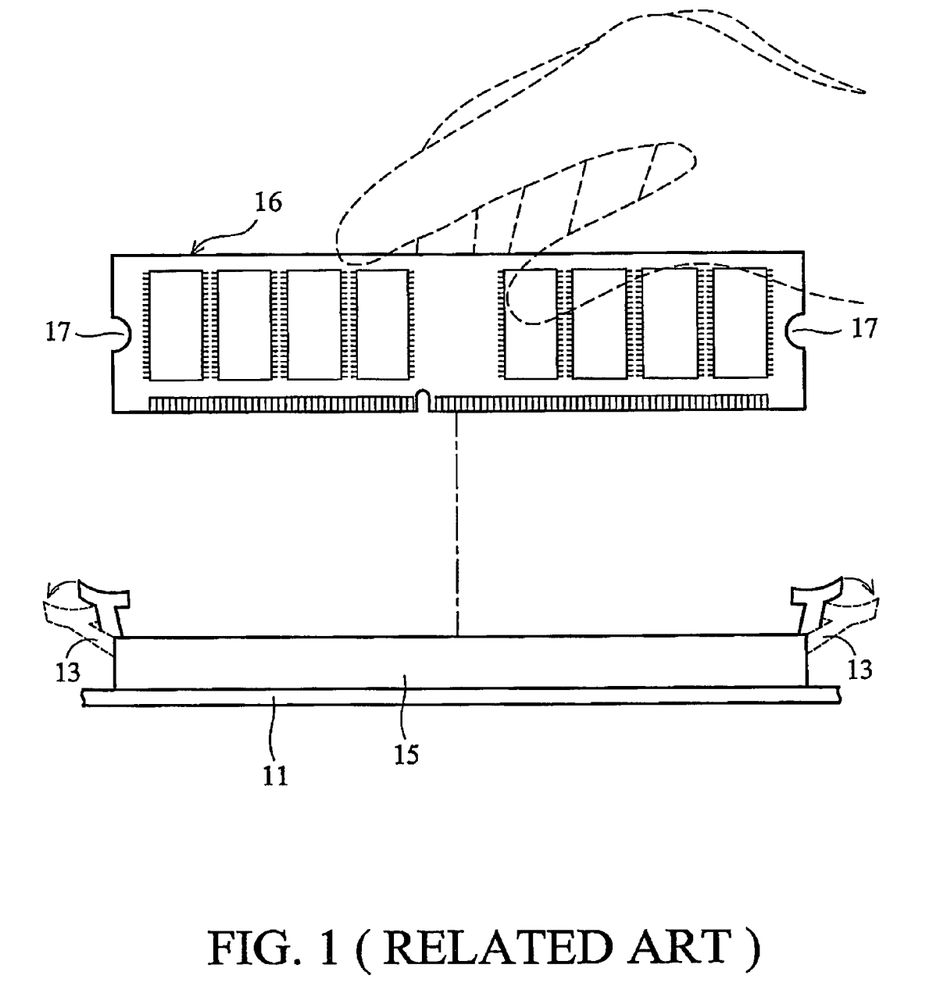
FIG. 1 shows manual insertion of an expansion board into an expansion slot in a conventional testing method.

Subsequent to manufacture, printed circuit boards (PCBs) must be tested to ensure quality thereof. In FIG. 1, an expansion board 16 is inserted into an expansion slot 15 of an untested PCB 11 by an operator prior to a conventional testing method.

Figure 2:
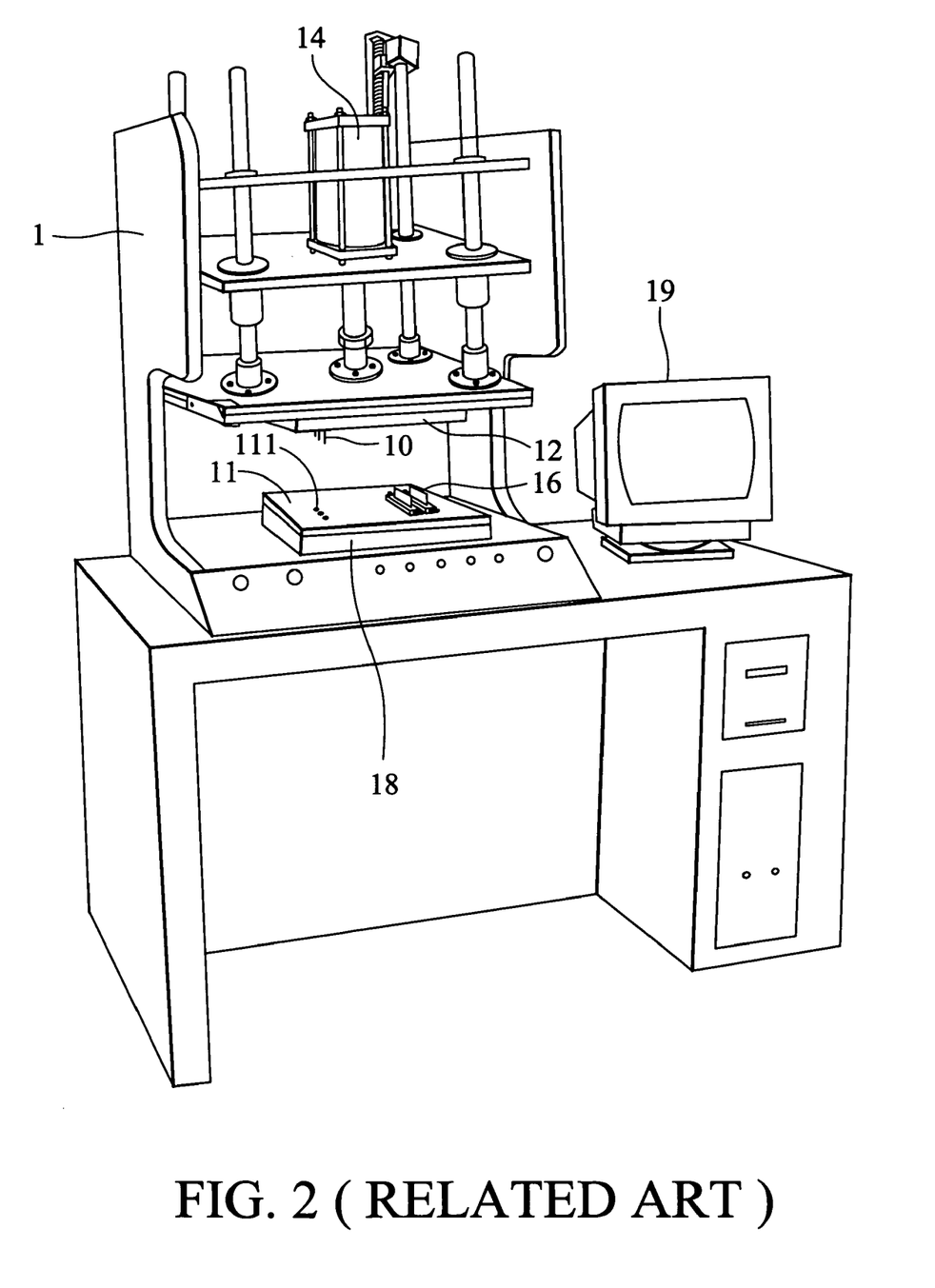
FIG. 2 is a schematic view of a conventional PCB testing mechanism.

FIG. 2 shows a conventional PCB testing mechanism 1. In FIG. 2, a PCB 11 with expansion boards 16 assembled thereon is disposed on a bottom plate 18 of the conventional PCB testing mechanism 1. Before testing a PCB by a conventional testing method, a driving device 14 lowers a top plate 12, and probes 10 thereon contact a plurality of test points 111 on the PCB 11, establishing electrical connections therebetween. Thus, whether each test circuit of the PCB 11 is conductive or not can be manually determined via an ohmmeter and shown on a monitor 19 of the PCB testing mechanism 1.

However, the conventional testing method has the following disadvantages:

Because each fabricated PCB 11 requires testing and there are only a few expansion boards 16, expansion boards 16 must be repeatedly manually removed from a previous PCB and then inserted in a next PCB. Thus, the conventional testing method is labor-intensive and time-consuming. Additionally, expansion boards 16 are thin, making them difficult to be hold during testing.

Moreover, expansion boards 16 are manually inserted into expansion slots 15 on untested PCBs 11, but are often inserted incorrectly, causing misalignments between the contact points of the expansion boards 16 and the expansion slots 15. Thus, the test result may be spurious and the expansion boards 16 may be damaged.

Furthermore, in FIG. 1, the engaging members 13 on either side of the expansion slot 15 must be pulled open before inserting the expansion board 16. Operators, however, sometimes forget to pull open the engaging members 13, causing the expansion board 16 to collide with the engaging members 13, thus resulting in damage to the expansion board 16 or the untested PCB 11.

SUMMARY OF THE INVENTION

Accordingly, an object of the invention is to ameliorate the disadvantages of the conventional testing method for PCBs. The present invention provides a PCB testing mechanism comprising a top plate, bottom plate, seat, holder, expansion card and at least one fixing member. The expansion board is partially disposed leaving the holder with a first edge thereof exposed. The first edge is for insertion into the expansion slot and has a contact zone for electrical connection to the expansion slot. The fixing member secures the expansion board in the holder mounted on the seat. The seat is disposed on the top plate, and the PCB is disposed on the bottom plate. The PCB testing mechanism further comprises a driving means for moving the top plate and inserting the expansion board into the relevant expansion slot.

The expansion board of the invention has at least one notch located at the border between the first edge and the second edge, and at least one edge of the notch is higher than the highest position of the engaging member, preventing collision between the expansion board and the engaging member when inserting the expansion board.

Accordingly, the expansion board can be automatically inserted by the PCB testing mechanism of the present invention, replacing the manual insertion procedure for increasing efficiency and stability and preventing operator error. Furthermore, the PCB testing mechanism of the present invention also prevents collision between the expansion board and the engaging member when inserting the expansion board, thus ameliorating the desired disadvantages of the conventional method.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings which are given by way of illustration only, and thus are not limitations of the present invention, and wherein.

DETAILED DESCRIPTION OF THE INVENTION

Figure 3:
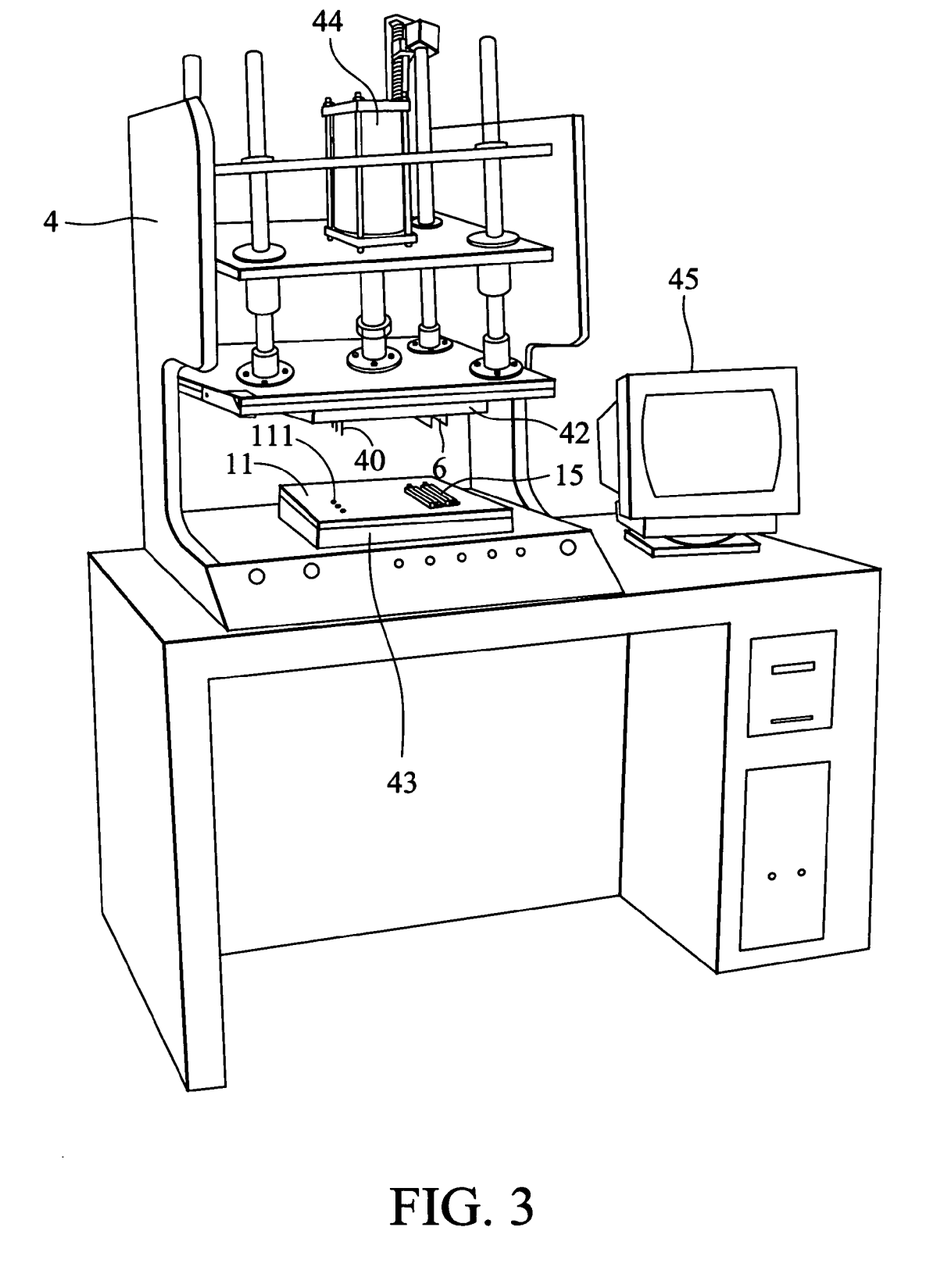
FIG. 3 is a schematic view of a PCB testing mechanism of an embodiment of the present invention.

In FIG. 3, two expansion cards 6, such as Dual In-line memory modules (DIMM), and probes 40 are disposed on a top plate 42 of the PCB testing mechanism 4 of an embodiment of the present invention. The number of the expansion cards 6 are not limited to two. During testing, an untested PCB 11 is disposed on a bottom plate 43 of the PCB testing mechanism 4. A driving device 44 can make a top plate 42 move upward and downward. The driving device 44 lowers the top plate 42, such that the expansion boards 6 are inserted into corresponding expansion slots 15 of the PCB 11, and the probes 40 contact the test points 111 of the PCB 11, establishing connections therebetween. Thus, whether the test circuit of the PCB 11 is conductive or not can be manually determined via an ohmmeter and shown on a monitor 45 of the PCB testing mechanism 4.

Subsequent to testing, the driving device 44, such as a motor or an air pump, raises the top plate 42, removing the expansion boards 6 and the probes 40 from the PCB 11 simultaneously. During the above mentioned steps, the expansion boards 6 fixed on the top plate 42 are automatically rather than manually inserted and removed by the PCB testing mechanism 4, thus increasing efficiency and reliability.

Placement of the expansion boards 6 on the top plate 42 through a jig 5 according to an embodiment of the invention is described in the following.

Figure 4:
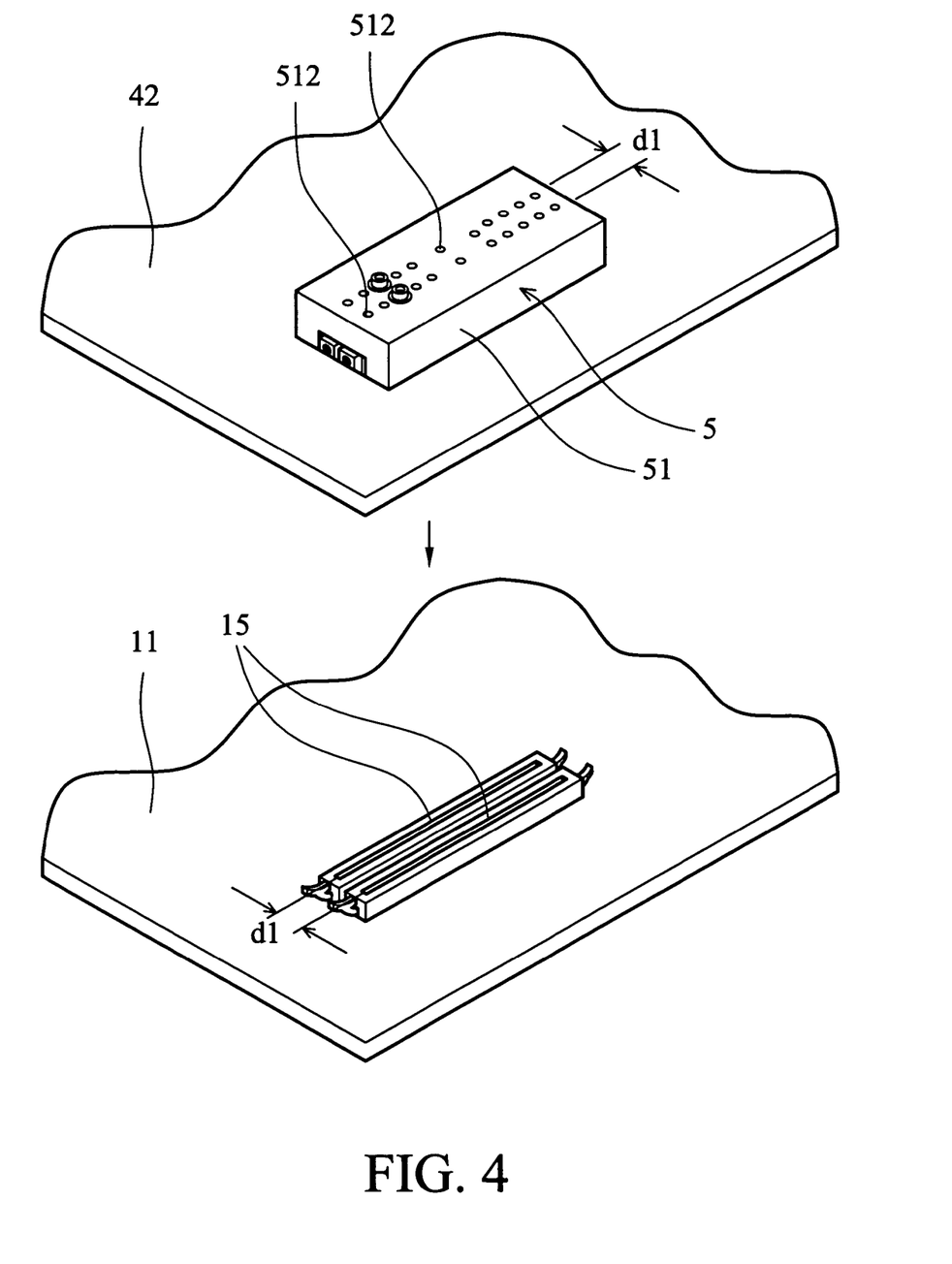
FIG. 4 shows a jig of an embodiment of the present invention disposed on a top plate thereof.
Figure 5:
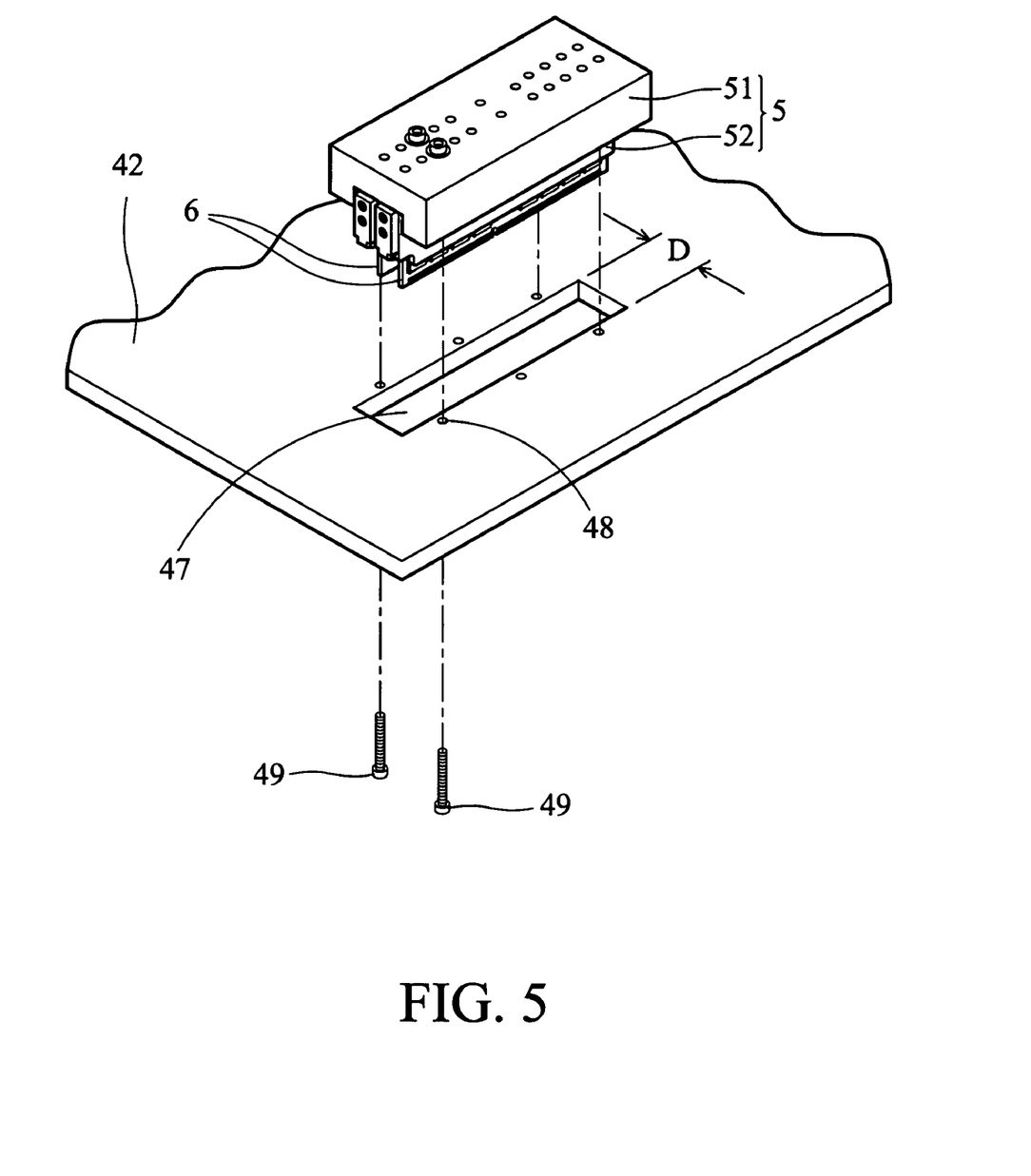
FIG. 5 is an stereopicture view of the jig with expansion boards assembled thereon and the top plate thereof according to an embodiment of the present invention.

In FIGS. 4 and 5, the jig 5 holds a plurality of expansion boards 6, but only two are given as an example in this embodiment. The top plate 42 has an opening 47 with a width D allowing holders 52 of the jig 5 to pass therethrough. A seat 51 of the jig 5, however, is wider than the opening 47, formed therein. The seat 51 of the jig 5 is fastened to the top plate 42 by screws 49 passing through the hole 48 thereof.

Figure 6:
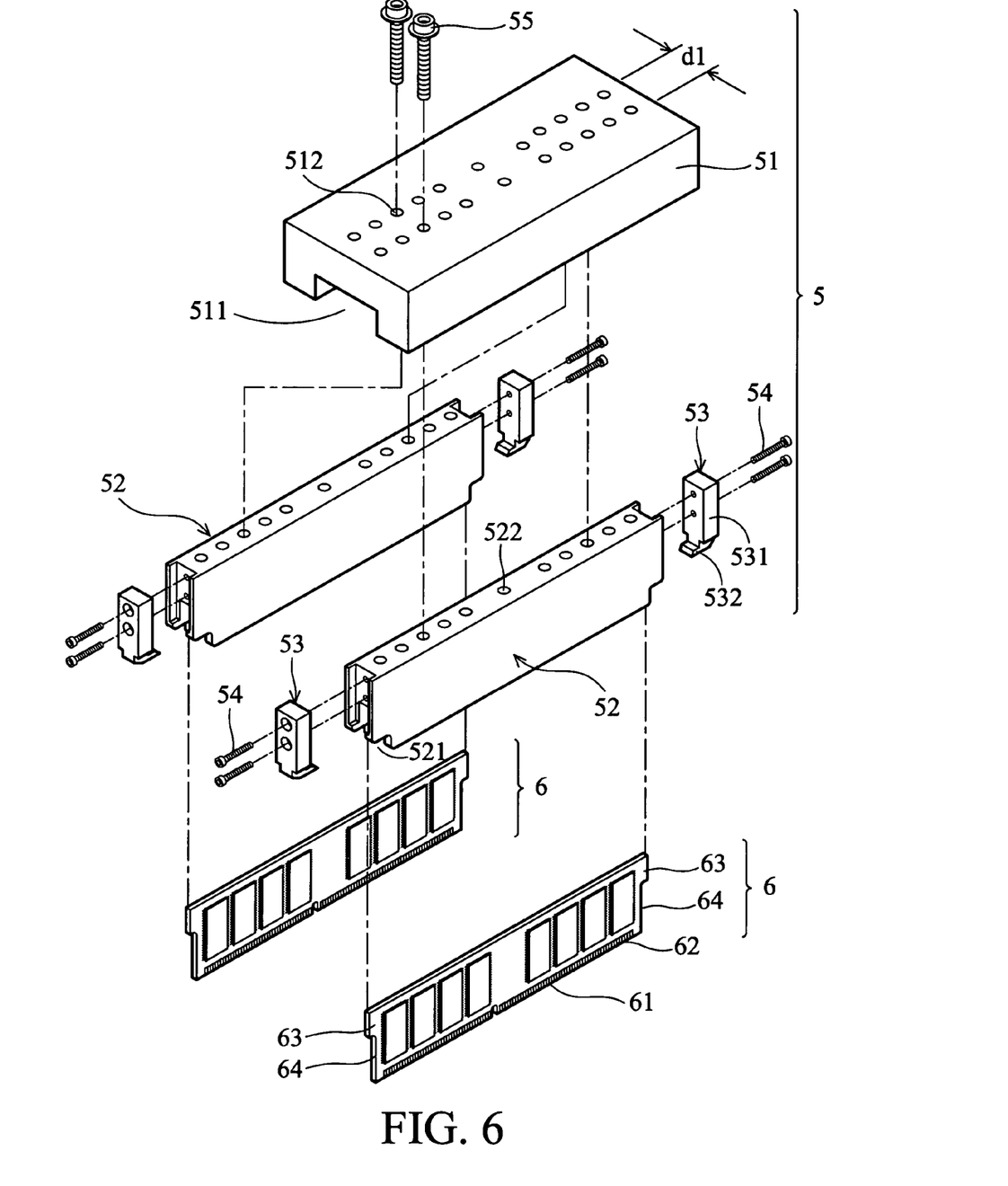
FIG. 6 is an exploded view of the jig with expansion boards assembled thereon according to an embodiment of the present invention.

In FIG. 6, the jig 5 comprises a plurality of fixing members 53, two holders 52 and a seat 51. Each holder has a groove 521 to receive part of an expansion board 6.

Each expansion board 6 has a first edge 61 with a contact zone 62 exposed when assembled on the holder 52. The first edge 61 is for insertion into the expansion slot 15 of the PCB 11, and the contact zone 62 thereof is for electrical connection to the expansion slot 15 of the PCB 11. The expansion board 6 has a second edge 64 with a lug 63 thereon, and the second edge 64 is substantially perpendicular to the fist edge 61.

Each fixing member 53 comprises a body 531 and an end 532. The body 531 of each fixing member 53 is fixed on either side of the holder 52 by screws 54. The end 532 is hooked, securing the lug 63 to fix the expansion board 6 in the holder 52.

The seat 51 is substantially n-shaped and has a recess 511 formed in the bottom to receive the holders 52. The holders 52 are secured on the seat 51 by the screws 55 passing through the holes 512 of the seat 51. As shown in FIG. 6, the holes 512 are arranged in two parallel rows separate from a gap d1 corresponding to the gap of the expansion slots 15 on the PCB. For example, if the gap between the expansion slots 15 on the PCB 11 is 10 cm as shown in FIG. 4, the gap d1 between the rows of holes 512 is also 10 cm.

When installing the expansion boards 6 on the PCB 11, the mechanism 4 of the present invention prevents collision between the expansion boards 6 and the engaging members 13 of the expansion slots 15, even if the engaging members 13 are not pulled open.

Figure 7:
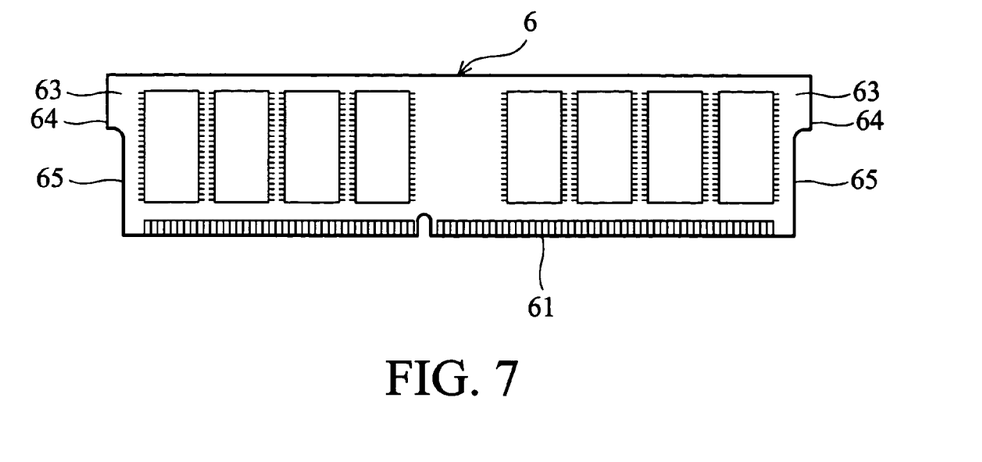
FIG. 7 is a front view of the expansion board according to an embodiment of the present invention.
Figure 8:
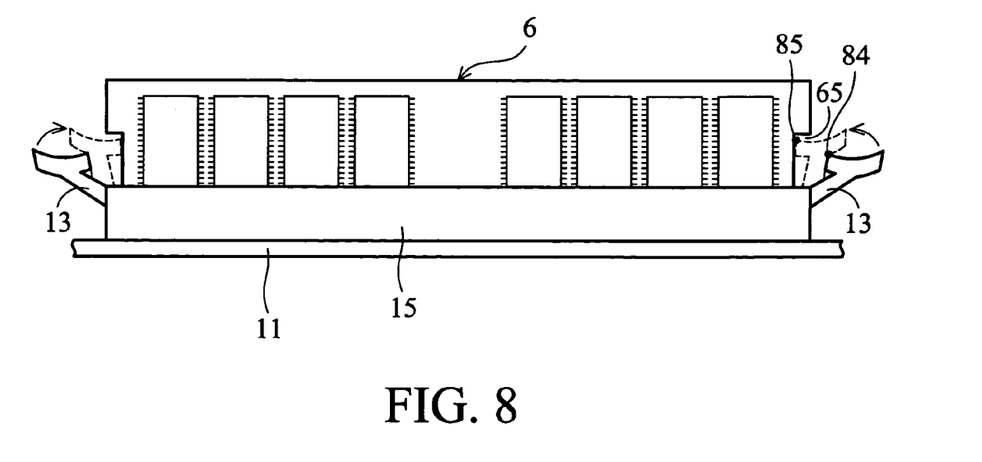
FIG. 8 shows an expansion board inserted into the expansion slot according to an embodiment of the present invention.

In FIG. 1, the conventional expansion board 16 comprises notches 17 on either side. When a conventional expansion board 16 is inserted into an expansion slot 15, the engaging members 13 clip the notches 17, fixing the expansion board 16 thereon. In contrast, in order to prevent collisions, protruding portions below the notches 17 of each conventional expansion board 16 are cut and used in the present invention as shown in FIG. 7. The expansion board 6 of the present invention has notches 65 located at the border between the first edge 61 and the second edges 64 on either side. The notches 65 are substantially rectangular and range from the lugs 63 to the first edge 61. In FIG. 8, the engaging members 13 are pivoted toward the expansion slot 15, rotating between a first position 84 and a second position 85. The second position 85 is the highest position of the engaging members 13 with respect to the expansion slot 15 during rotation, and at least one edge of the notch 65 is higher than the second position 85 of the engaging member 13. The engaging member 13 of the present invention is able to rotate when the expansion board 6 is installed in the expansion slot 15, thus preventing collision therebetween.

Accordingly, the expansion board can be automatically inserted by the PCB testing mechanism of the present invention, replacing conventional manual insertion, thus increasing efficiency and stability. The PCB testing mechanism of the present invention also prevents collision between the expansion board and the engaging member when inserting the expansion board, thus ameliorating the desired disadvantages of the conventional testing method.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A mechanism for testing a printed circuit board, the printed circuit board having an expansion slot with at least one engaging member, comprising:
    a holder;
    an expansion board partially disposed in the holder with a first edge thereof exposed, wherein the first edge is for insertion into the expansion slot and has a contact zone for electrical connection to the expansion slot; and
    a fixing member fixing the expansion board on the holder, wherein the fixing member comprises a body and an end, the expansion board comprises a lug, the body is fixed on the holder, and the end contacts the lug to fix the expansion board.

2. The mechanism as claimed in claim 1, wherein the body of the fixing member is fastened to the holder, and the end secures the lug, fixing the expansion board on the holder.

3. The mechanism as claimed in claim 2, wherein the end is hooked.

4. The mechanism as claimed in claim 1, wherein the expansion board has a second edge with the lug thereon, and the second edge is substantially perpendicular to the first edge.

5. The mechanism as claimed in claim 1, wherein the engaging member is pivoted to the expansion slot, rotating between a first position and a second position, and has a highest position with respect to the expansion slot during rotation.

6. The mechanism as claimed in claim 5, wherein the highest position of the engaging member is the second position.

7. The mechanism as claimed in claim 5, wherein the expansion board has at least one notch located at the border between the first edge and the second edge, and at least one edge of the notch is higher than the highest position of the engaging member, preventing collision between the expansion board and the engaging member when inserting the expansion board.

8. The mechanism as claimed in claim 7, wherein the notch is substantially rectangular.

9. The mechanism as claimed in claim 1, wherein the holder is a substantially rectangular solid comprising a groove on the bottom surface for receiving the expansion board.

10. The mechanism as claimed in claim 1, further comprising a seat, securing the holder.

11. The mechanism as claimed in claim 10, wherein the seat has at least one first hole, the holder has at least one second hole, and at least one holder is fastened to the seat according to the position of the first hole.

12. The mechanism as claimed in claim 1, wherein the expansion board is a memory module (DIMM).

13. The mechanism as claimed in claim 1, further comprising a top plate and a bottom plate, the holder is disposed on the top plate, and the printed circuit board is disposed on the bottom plate.

14. The mechanism as claimed in claim 10, further comprising a top plate and a bottom plate, the seat is disposed on the top plate, and the printed circuit board is disposed on the bottom plate.

15. The mechanism as claimed in claim 1, further comprising a driving means for moving the top plate, thereby inserting the expansion board into the corresponding expansion slot.

* * * * *